US010317948B2

United States Patent
(12) United States Patent
Klug

(10) Patent No.: US 10,317,948 B2
(45) Date of Patent: Jun. 11, 2019

(54) FLEXIBLE DISPLAY FOR DISPLAYING DEPTH INFORMATION

(71) Applicant: AUDI AG, Ingolstadt (DE)

(72) Inventor: Markus Klug, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 15/753,081

(22) PCT Filed: Aug. 3, 2016

(86) PCT No.: PCT/EP2016/068501
§ 371 (c)(1),
(2) Date: Feb. 15, 2018

(87) PCT Pub. No.: WO2017/036716
PCT Pub. Date: Mar. 9, 2017

(65) Prior Publication Data

US 2018/0260001 A1 Sep. 13, 2018

(30) Foreign Application Priority Data

Aug. 29, 2015 (DE) ........................ 10 2015 011 403

(51) Int. Cl.
*G02B 27/22* (2018.01)
*G02F 1/1333* (2006.01)
(Continued)

(52) U.S. Cl.
CPC ............ *G06F 1/1652* (2013.01); *B60K 35/00* (2013.01); *G02B 27/2264* (2013.01);
(Continued)

(58) Field of Classification Search
CPC ................ G06F 1/1641; G06F 1/1652; G06F 1/133305; G06F 2203/04102; G09G 2340/10; H01L 51/0097; H01L 2251/5338
See application file for complete search history.

(56) References Cited

U.S. PATENT DOCUMENTS

2007/0063921 A1 3/2007 Harada et al.
2013/0076612 A1 3/2013 Myers
(Continued)

FOREIGN PATENT DOCUMENTS

CN 103365594 10/2013
CN 103455138 12/2013
(Continued)

OTHER PUBLICATIONS

English Translation of the International Preliminary Report on Patentability dated Mar. 15, 2018, in corresponding International Patent Application No. PCT/EP2016/068501, 7 pgs.
(Continued)

*Primary Examiner* — Xuemei Zheng
(74) *Attorney, Agent, or Firm* — Staas & Halsey LLP

(57) ABSTRACT

A method for displaying data in at least two physical planes of a flexible display includes bending the flexible display in such a way that a first part of the display is positioned in a second plane behind a second part of the display, which is positioned in a first plane, as seen by the viewer, so that at least data relating to depth information from data which is displayed on the second part of the display can be displayed on the first part of the display. The display can be provided in a vehicle.

18 Claims, 3 Drawing Sheets

35
37
31
30
32
38
a)
34
35
33
37
31
30
32
36
b)
34

(51) Int. Cl.

| | |
|---|---|
| ***G06F 1/16*** | (2006.01) |
| ***B60K 35/00*** | (2006.01) |
| ***H01L 51/00*** | (2006.01) |
| ***H04N 13/395*** | (2018.01) |
| *G02F 1/1347* | (2006.01) |

(52) U.S. Cl.

CPC ...... *G02B 27/2278* (2013.01); *H01L 51/0097* (2013.01); *H04N 13/395* (2018.05); *B60K 2350/2017* (2013.01); *B60K 2350/405* (2013.01); *G02F 1/1347* (2013.01); *G02F 1/133305* (2013.01); *G06F 2203/04102* (2013.01); *G09G 2340/10* (2013.01); *G09G 2380/02* (2013.01); *H01L 2251/5338* (2013.01); *Y02E 10/549* (2013.01)

(56) References Cited

U.S. PATENT DOCUMENTS

| | | | | |
|---|---|---|---|---|
| 2014/0035942 | A1* | 2/2014 | Yun | G09G 5/006 345/592 |
| 2014/0333663 | A1 | 11/2014 | Yamada et al. | |
| 2015/0257289 | A1* | 9/2015 | Lee | H05K 5/0017 361/749 |
| 2016/0231837 | A1* | 8/2016 | Baek | G06F 3/044 |
| 2017/0003794 | A1* | 1/2017 | Gao | G06F 3/1423 |

FOREIGN PATENT DOCUMENTS

| | | | |
|---|---|---|---|
| CN | 104409024 | | 3/2015 |
| CN | 104685460 | | 6/2015 |
| DE | 197 32 156 | A1 | 1/1998 |
| DE | 10 2015 011 403.4 | | 8/2015 |
| EP | 1 245 429 | A2 | 10/2002 |
| EP | 2 166 443 | A2 | 3/2010 |
| EP | 2 648 066 | A2 | 10/2013 |
| EP | 2 669 771 | A1 | 12/2013 |
| EP | 2 743 906 | A1 | 6/2014 |
| GB | 2 503 337 | A | 12/2013 |
| WO | PCT/EP2016/068501 | | 8/2016 |

OTHER PUBLICATIONS

German Office Action dated Mar. 24, 2016 from German Patent Application No. 10 2015 011 403.4, 6 pages.

International Search Report dated Oct. 14, 2016 from International Patent Application No. PCT/EP2016/068501, 2 pages.

Chinese Office Action dated Jul. 4. 2018 from Chinese Patent Application No. 201680034768.8, 5 pages.

* cited by examiner a)
b)
c)
d)
20
21
22
23
24
25
26

FLEXIBLE DISPLAY FOR DISPLAYING DEPTH INFORMATION

CROSS REFERENCE TO RELATED APPLICATIONS

This application is a U.S. national stage of International Application No. PCT/EP2016/068501, filed on Aug. 3, 2016. The International Application claims the priority benefit of German Application No. 10 2015 011 403.4 filed on Aug. 29, 2015. Both the International Application and the German Application are incorporated by reference herein in their entirety.

BACKGROUND

Described herein is a method for displaying data in at least two spatial planes, a display, and a vehicle.

To present depth information, i.e. data with spatial or three-dimensional characteristics, 3D monitors are normally used, which require special spectacles or fixed viewing angles. In addition, it is also possible to combine different displays in order thereby to produce a depth effect.

As such, the German Patent Application No. 1973 21 56 A1 proposes an electroluminescent display for overlaying an analog display.

In U.S. Patent Application No. 2014/0333663 A1 describes multiple mutually overlying and partially opaque screens to form a display apparatus.

Displays movable in relation to one another and arranged behind one another having transparent regions are described in U.S. Patent Application No. 2007/0063921 A1.

SUMMARY

Against this background, a method for displaying data in at least two spatial planes of a flexible display is disclosed, wherein the flexible display is flexed such that at least one first portion of the display is positioned in a second plane from the viewer's perspective behind at least one second portion of the display situated in a first plane, so that the at least one first portion of the display can be used to present at least data pertaining to depth information from data presented on the at least one second portion of the display.

The disclosed method is used, for example, to present data having depth information using a single display in the form of a flexible display, such as an OWED display film, for example. To this end, there is, for example, provision for a depth effect to be produced by virtue of the display overlying itself. This means that the display described herein overlies or overlaps itself at least in part in multiple planes, so that a viewer of the display can look through a respective second portion of the display onto a respective first portion of the display. To this end, the display can be flexed such that, by way of example, the first portion of the display, such as a first half of the display, for example, is positioned in a second plane behind a second portion of the display, such as a second half, for example, situated in a first plane.

Naturally, respective portions of the display may also be portions that are smaller than one half of the display, so that respective first portions are positioned behind the at least one second portion only in sections. In addition, it is also possible for a multiplicity of first and second portions to be provided, so that the display frequently overlies itself. Accordingly, it is also possible for a multiplicity of planes to be provided in which respective first and second portions are positioned, a second portion of the display always being perceived as the topmost plane by a viewer.

Within the context of the disclosure, "overlie" is intended to be understood to refer to reciprocal spatial coverage or coincidence of respective portions of a display in different planes, i.e. above or below one another from a viewer's perspective.

There may also be provision for a second portion of a respective display to be flexed in front of a respective first portion of the display from the viewer's perspective.

Within the context of the disclosure, a viewer's perspective is intended to be understood to refer to a perspective of a viewer of a respective display that is directed at a topmost second portion of the display, so that the viewer views respective first portions of the display through the topmost second portion of the display. Accordingly, there is provision for respective second and possibly first portions of the display to be of at least partially transparent configuration.

As soon as different portions of the display provided according to the disclosure overlie one another, i.e. are in or situated in different spatial planes from one another, it is possible to use the different portions to selectively present information that complements itself on the different portions of the display to form an overall image that is coherent for a user viewing all the portions of the display. In this case, there is, for example, provision for a portion of the display that is arranged in a respective rear plane from the viewer's perspective to be used to present such information or data as is/are meant to convey an impression of depth for the overall image to the user. As such, there may be provision, by way of example, for a portion of the display that is arranged in a respective foremost plane to be used to present virtual operator control elements or user interfaces, such as buttons, for example, that activate functions that are situated in a lower plane and accordingly are presented on that portion of the display that is situated in a plane behind the foremost plane.

Within the context of the disclosure, depth information is intended to be understood to refer to such information or data as conveys/convey a three-dimensional impression for a piece of two-dimensional information.

It is further conceivable that a respective first portion of a respective display is used to present data that are independent of data presented on a respective second portion of the display. Naturally, it is accordingly also conceivable that the second portion of the display is used to present data that are independent of data presented on the first portion of the display, so that the first and second portions of the display can be used to present content independently of one another, wherein merely partially independent data, i.e. both depth information and independent data, can also be presented on a respective portion of the display.

In one possible configuration of the disclosure, there is provision for the at least one first portion of the display to be moved behind the at least one second portion of the display such that prescribed points on the at least one second portion of the display are positioned in front of prescribed points on the at least one first portion of the display.

To orient a respective first portion of a display in relation to a respective second portion of the display, there may be provision for a user who flexes or folds the display to have orientation points presented to him that display an optimum orientation for the second portion of the display in relation to the first portion of the display when the orientation points are congruent, for example, or are in a geometric orientation in relation to one another, while the different portions of the display are positioned in different planes.

Naturally, it is also conceivable for a current orientation of a respective first portion of a display in relation to a respective second portion of the display to be sensed by using a suitable sensing apparatus, such as an optical or mechanical sensor, for example, and reported to a controller. As soon as the controller has information pertaining to the orientation of the first portion of the display relative to the second portion of the display, the controller can output an output of data or information in a manner adapted to the current orientation and can produce a precise impression of depth, attuned to a current orientation of the display or respective portions of the display, for a user and/or can confirm a correct orientation of respective portions of the display in relation to one another to the user.

In a further possible configuration of the disclosure, there is provision for the at least one first portion of the display to be moved over a substantially semi-circular radius behind the at least one second portion of the display.

To flex a respective first portion of a display behind a respective second portion of the display, a substantially semi-circular flexure along a 180° radius, for example, is suitable, so that the display is, for example, not bent and therefore not damaged.

In a further possible configuration of the disclosure, there is provision for the at least one first portion of the display to be turned behind the at least one second portion of the display.

To allow fast and precise orientation of a respective first portion of a display in relation to a second portion of the display, prescribed turn or fold locations are suitable at which the display is bent or turned or folded, so that the first portion moves along a prescribed path of motion relative to the second portion.

Naturally, there may also be provision for a second portion of the display to be turned or bent or pushed in front of a first portion of the display.

In a further possible configuration of the disclosure, there is provision for respective first portions of the display and respective second portions of the display to be actuated independently of one another, and for a first portion of the display to present a background for a foreground presented on a second portion of the display, for example.

To provide a user of the display with an impression of depth on a respective display, it may be advantageous that respective first and second portions of the display are actuated separately from one another. For example, for applications in a vehicle, it may be advantageous if a portion of the display, such as a first portion, for example, is used for a dynamic display that is continually updated, and a further portion of the display, such as a second portion of the display, for example, behaves statically and constantly displays information that does not change or changes only very slowly to the user.

In addition, it is conceivable for staggered switching of a first portion of the display and a second portion of the display to present to a user a 3D effect in which different eyes of the user are presented with different information.

In a further possible configuration of the disclosed method, there is provision for the at least one first portion of the display to be used to present a mirrored depiction of information to be presented in order to allow a respective user an impression matched to respective information presented on the at least one second portion of the display when viewing the first portion of the display through the at least one second portion of the display.

Since respective data presented on a first portion flexed behind the second portion would be perceived in mirror-inverted fashion by a user if the data were to retain their orientation after a flexing process, there is provision for the orientation of the data that are to be displayed on the first portion to be mirrored after or during the flexing process in order to be interpreted correctly by the user.

In a further possible configuration of the disclosed method, there is provision for the at least one first portion of the display to overlie the at least one second portion of the display merely in part and for information with a depth difference to be presented in regions in which the at least one first portion of the display overlies the at least one second portion of the display at least in part and for data without depth information to be presented in a region in which merely the at least one second portion of the display is visible to a respective user.

Naturally, it is conceivable for the first portion of the display to be merely partially flexed behind the second portion of the display, so that a respective user is able to identify regions with depth information and regions without depth information on the display. In this case, the regions of the second portion of the display that do not overlie a respective first portion of the display can be used for presenting 2D information that, by way of example, interacts with information that is presented in the regions of the second portion of the display that overlie the first portion of the display and, by way of example, is controlled by control commands presented using depth information.

In a further possible configuration of the disclosed method, there is provision for a multiplicity of first portions of the display to be moved behind the second portion of the display or a multiplicity of second portions of the display.

It is conceivable that the display according to the disclosure is flexed repeatedly, so that a multiplicity of overlay regions are formed that provide a user with a multiplicity of regions having depth information. For example, there may also be provision for the display to be flexed repeatedly such that a multiplicity of alternating first and second portions of the display are formed. In this case, there is provision for respective information to be presented to always be presented normally by respective first portions and to always be presented in mirrored fashion in relation to the respective first portions by respective second portions.

Further, described herein is a display for displaying information in at least two spatial planes, wherein the display can be flexed such that at least one first portion of the display can be positioned in a second plane from the viewer's perspective behind at least one second portion of the display situated in a first plane, so that the at least one first portion of the display can be used to present at least depth information from data to be presented on the at least one second portion of the display.

The display is used, for example, for performing the disclosed method.

In one possible configuration of the display, there is provision for a respective second portion of the display to have at least one user interface arranged on it that is configured to control at least one function on a respective first portion of the display, wherein the display includes a controller that is configured to coordinate information or data to be presented on the first portion of the display and data to be presented on the second portion of the display, so that an impression of depth is formed for a user of the display.

To arrange respective information to be presented on a first and a second portion of a display such that a consistent overall impression is formed for a user, it is necessary for content of a respective second portion of the display to be accurately attuned to content of a respective first portion of the display or for content of the first portion of the display to be accurately attuned to content of the second portion of the display, i.e. for the content to be oriented relative to one another for example in spatial terms. To this end, there is provision for a correct spatial orientation of the first portion of the display in relation to the second portion of the display to be sensed by using a sensor, for example, during a calibration and stored in a controller that the display includes. On the basis of the known relative spatial orientation of the first portion of the display in relation to the second portion of the display, the controller can correct the orientation of any content to be presented, i.e. data to be presented, on the first and/or second portion of the display, so that a precise impression of depth is formed for a user.

In one possible configuration of the proposed display, there is provision for at least the at least one second portion of the display to be of at least partially transparent configuration.

To present information to a viewer of the display through a respective portion of the display, there is provision for respective second portions of the display to be of at least partially transparent configuration.

Further, described herein is a vehicle having a display for displaying information in at least two spatial planes, wherein the display can be flexed such that at least one first portion of the display can be positioned in a second plane, from the viewer's perspective, behind at least one second portion of the display situated in a first plane, so that the at least one first portion of the display can be used to present at least depth information from information to be presented on the at least one second portion of the display, wherein the at least one first portion and/or the at least one second portion of the display can be moved along a trajectory prescribed by the vehicle.

In one possible configuration of the vehicle, there is provision for the trajectory to be prescribed by at least one rail in which the display can be moved.

A rail can be used to move a respective first portion relative to a respective second portion of a respective display quickly and exactly.

In a further possible configuration of the vehicle, there is provision for the vehicle to include a servo drive that is configured to adjust a distance between the at least one first portion of the display and the at least one second portion of the display automatically and dynamically on the basis of respective information to be presented on the display.

Since different information requires different depth dimensions, it may make sense if a distance between the first and second portions of a respective display is adapted.

Within the context of the disclosure, a rail is intended to be understood to refer to any technically suitable guide device for guiding a flexible display on a prescribed path or trajectory when the display is flexed.

Further advantages and configurations of the disclosure will emerge from the description and the accompanying drawings.

It goes without saying that the features cited above and those yet to be explained below can be used not only in the respectively indicated combination but also in other combinations or on their own without departing from the scope of the disclosure.

BRIEF DESCRIPTION OF THE DRAWINGS

These and other aspects and advantages will become more apparent and more readily appreciated from the following description of the exemplary embodiments, taken in conjunction with the accompanying drawings of which.

DETAILED DESCRIPTION OF THE PREFERRED EMBODIMENT

Figure 1:
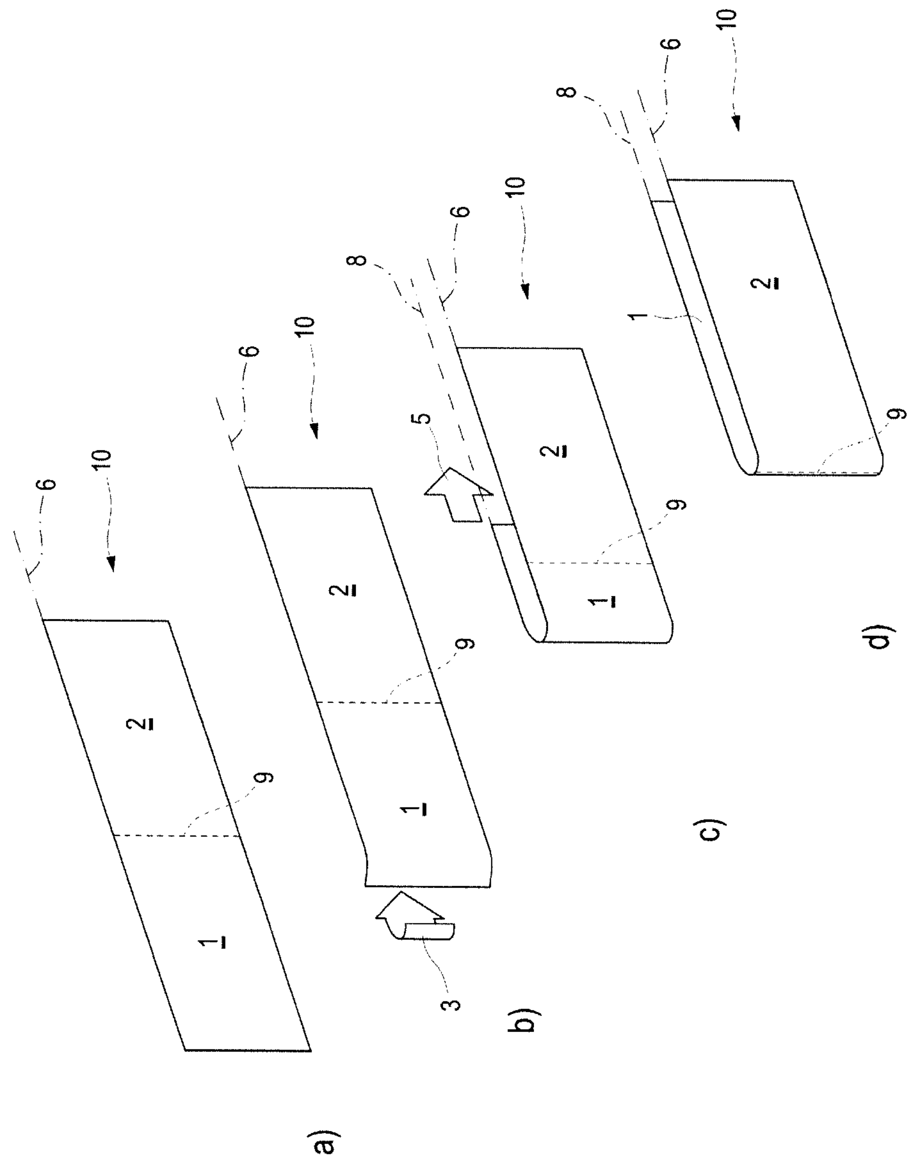
FIG. 1 is an example configuration of the method in which a display is flexed.

Reference will now be made in detail to example embodiments, which are illustrated in the accompanying drawings, wherein like reference numerals refer to like elements throughout.

FIG. 1 depicts a display 10 with a first portion 1 and a second portion 2 according to an operation a). In operation a), the first portion 1 and the second portion 2 are situated in a plane 6.

In order to present to a user of the display 10 a depth content, such as a map displayed behind a digital instrument panel, for example, the first portion 1 of the display 10 is flexed in an operation b), as indicated by arrow 3, so that the first portion 1 moves into a second plane 8 behind the second portion 2 of the display 10. As soon as the first portion 1 is in the second plane 8, the first portion 1 is oriented in relation to the second portion 2, as indicated by arrow 5 in operation c). In order to orient the first portion 1 relative to the second portion 2 and to allow precise adaptation of data to be presented on the first portion 1 to suit data to be presented on the second portion 2, the first portion 1 is moved in the plane 8 until the first portion 1 is in a prescribed spatial position relative to the second portion 2 and a marker 9 is exactly at a flexure location between the first portion 1 and the second portion 2, for example, as indicated in operation d).

After the first portion 1 has been flexed behind the second portion 2, as depicted in operation d), the user always views the display 10 through the second portion 2. This means that the user views the first portion 1 through the second portion 2, which means that the first portion 1 can provide in plane 8 depth information for information or data presented on the second portion 2 in plane 6. Since the first portion 1 is still part of the display 10, information to be presented on the first portion 1 needs to be presented in a mirrored depiction relative to the information to be presented on the second portion 2. Accordingly, the first portion 1 and the second portion 2 are actuated separately from one another by one or more controllers. Accordingly, there is provision for the second portion 2 to be at least partially transparent.

Figure 2:
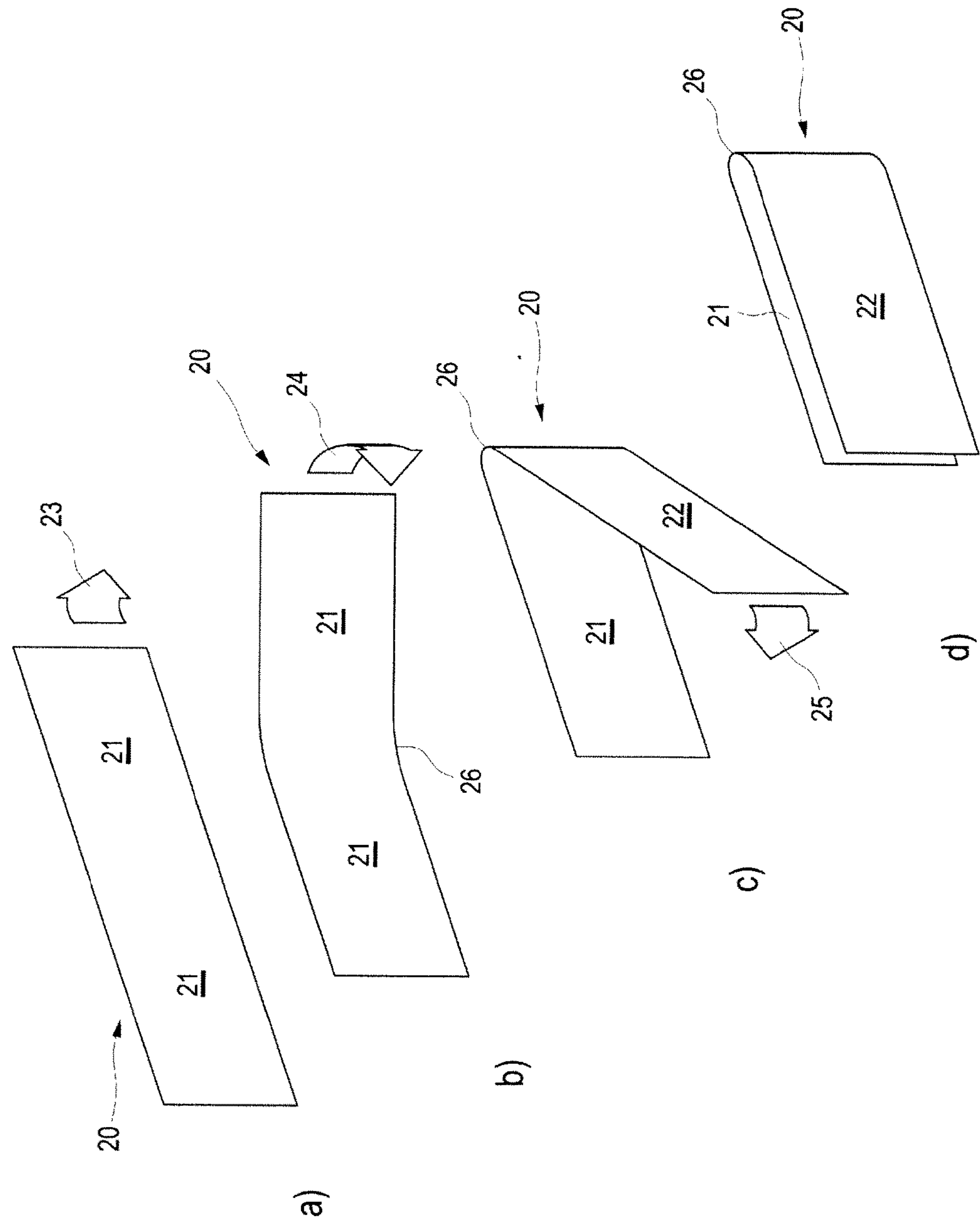
FIG. 2 is an example configuration of the method in which a display is bent.

In FIG. 2, the process described in FIG. 1 is implemented by using a fold process. This means that a display 20 is folded in a first operation a) such that a second portion 22 of the display 20 moves relative to a first portion 21 of the display 20, as indicated by arrow 23 and arrow 24 in operation b) and arrow 25 in operation c). Accordingly, the second portion 22 is moved until the second portion 22 comes to rest over the first portion 21, as shown in operation d). In this case, the second portion 22 is swiveled along a prescribed trajectory and does not need to be oriented exactly, since a position 26 at which the display 20 is bent prescribes the trajectory.

Figure 3:
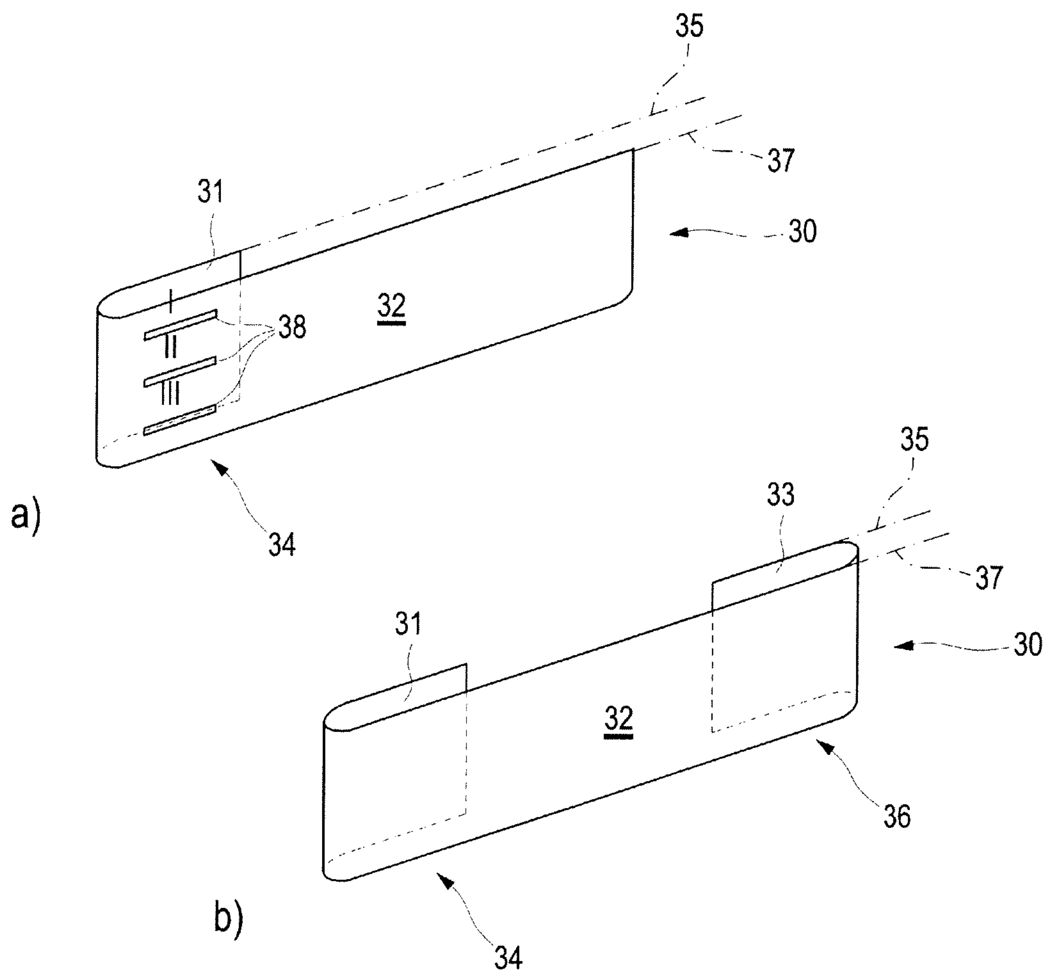
FIG. 3 is an example configuration of the method in which a display is repeatedly flexed.

FIG. 3 depicts a display 30 with a second portion 32. The second portion 32 has been flexed first of all in an operation a), so that a first portion 31 of the display 30 is positioned in a rear plane 35, as seen by a viewer, behind the second portion 32. As a result of the positioning of the first portion 31 behind the second portion 32, which is situated in a front plane 37, an overlay region 34 is formed by the first portion 31 and the second portion 32. The distance between the rear plane 35 and the front plane 37 can be changed on the basis of a respective function, for example, dynamically and automatically. Accordingly, the rear plane 35 is situated, depending on the desired function, a few millimeters to a few centimeters away from the front plane 37.

In operation a), functions I, II and III that can be activated using control buttons 38 presented on the second portion 32 of the display 30 are presented on the first portion 31 of the display 30, for example. Accordingly, an impression of depth for the control buttons 38 is conveyed to a respective user of the display 30 by the functions I, II and III presented on the first portion 31 of the display 30, which means that the user is provided with the impression that the control buttons are moved from the second portion 32 of the display 30 into the first portion 31 of the display 30 when the user touches or operates the control buttons 38.

In operation b), a third portion 33, as a further first portion of the display 30, has been flexed behind the second portion 32 of the display 30, so that, in addition to the region 34, a region 36 is formed in which depth information pertaining to respective data presented on the second portion 32 can be presented, whereas the portion of the second portion 32 that is not overlain by the first portion 31, or the third portion 33, can be used to present such information which includes no depth information.

A description has been provided with reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in Superguide v. DIRECTV, 358 F3d 870, 69 USPQ2d 1865 (Fed. Cir. 2004).

The invention claimed is:

1. A method for displaying data in at least two spatial planes of a flexible display, the method comprising:
- flexing the flexible display such that at least one first portion of the flexible display is positioned in a second plane behind at least one second portion of the flexible display positioned in a first plane, with respect to a viewing perspective of a user;
- presenting, on the at least one first portion of the flexible display, at least data pertaining to depth information of data presented on the at least one second portion of the flexible display, the at least data pertaining to depth information of data presented on the at least one second portion of the flexible display being visible through the at least one second portion of the flexible display from the viewing perspective of the user; and
- mirroring an orientation of the at least data pertaining to depth information presented on the at least one first portion of the flexible display to allow the user an impression that the at least data pertaining to depth information presented on the at least one first portion of the flexible display matches respective information presented on the at least one second portion of the flexible display.

2. The method as claimed in claim 1, further comprising moving the at least one first portion of the flexible display behind the at least one second portion of the flexible display such that prescribed points on the at least one second portion of the flexible display are positioned behind prescribed points on the at least one first portion of the flexible display.

3. The method as claimed in claim 1, wherein the at least one first portion of the flexible display is moved along a substantially semi-circular radius to position the at least one first portion of the flexible display behind the at least one second portion of the flexible display.

4. The method as claimed in claim 1, further comprising:
- actuating the at least one first portion of the flexible display and the at least one second portion of the flexible display independently from one another to present respective information; and
- presenting a background on the at least one first portion of the flexible display and presenting a foreground on the at least one second portion of the flexible display.

5. The method as claimed in claim 1, further comprising moving a plurality of first portions of the flexible display behind the at least one second portion of the display.

6. The method as claimed in claim 1, further comprising moving a plurality of first portions of the flexible display behind a plurality of second portions of the display.

7. A method for displaying data in at least two spatial planes of a flexible display, the method comprising:
- flexing the flexible display such that at least one first portion of the flexible display is positioned in a second plane behind at least one second portion of the flexible display positioned in a first plane, with respect to a viewing perspective of a user; and
- presenting, on the at least one first portion of the flexible display, at least data pertaining to depth information of data presented on the at least one second portion of the flexible display, wherein
- the flexible display includes a first end part, a central part, and a second end part,
- the at least one first portion of the flexible display includes a first part and a second part,
- the first part of the at least one first portion corresponds to the first end part of the flexible display which is moved in a first direction over a substantially semi-circular radius behind the at least one second portion of the display,
- the second part of the at least one first portion corresponds to the second end part of the flexible display which is moved in a second direction over a substantially semi-circular radius behind the at least one second portion of the display, and
- the at least one second portion of the flexible display corresponds to the central part of the flexible display, the at least one second portion having one part disposed to overlap the first part of the at least one first portion, another part to overlap the second part of the at least one first portion, and a third part not overlapping the at least one first portion in the direction relative to the viewing perspective of the user.

8. A method for displaying data in at least two spatial planes of a flexible display, the method comprising:
- flexing the flexible display such that at least one first portion of the flexible display is positioned in a second plane behind at least one second portion of the flexible display positioned in a first plane, with respect to a viewing perspective of a user; and
- presenting, on the at least one first portion of the flexible display, at least data pertaining to depth information of data presented on the at least one second portion of the flexible display, wherein
- the at least one first portion of the flexible display is positioned in the second plane such that the at least one first portion of the flexible display partially overlaps the at least one second portion of the flexible display in the direction relative to the viewing perspective of the user, information with a depth difference is presented in regions in which the at least one first portion of the flexible display partially overlaps the at least one second portion of the flexible display, and data without depth information are presented in a region of the at least one second portion of the flexible display which does not overlap with the at least one first portion of the flexible display and which is visible to the user.

9. A flexible display, comprising:

at least one first portion; and at least one second portion, the flexible display being configured to be flexed such that the at least one first portion of the flexible display is positioned in a second plane behind the at least one second portion of the flexible display positioned in a first plane, with respect to a viewing perspective of a user; and at least one controller configured to control the at least one first portion of the flexible display to present at least depth information of data presented on the at least one second portion of the flexible display such that the depth information of data presented on the at least one second portion of the flexible display is visible through the at least one second portion of the flexible display from the viewing perspective of the user, and to mirror an orientation of the at least data pertaining to depth information presented on the at least one first portion of the flexible display to allow the user an impression that the at least data pertaining to depth information presented on the at least one first portion of the flexible display matches respective information presented on the at least one second portion of the flexible display.

10. The display as claimed in claim 9, wherein the at least one second portion of the flexible display includes at least one user interface, disposed on the at least one second portion, configured to control at least one function on the at least one first portion of the flexible display.

11. The display as claimed in claim 9, wherein the at least one second portion of the flexible display is of at least a partially transparent configuration.

12. A vehicle, comprising:

a chassis; and a flexible display, including:

at least one first portion, and at least one second portion, the flexible display being configured to be flexed such that the at least one first portion of the flexible display is positioned in a second plane behind the at least one second portion of the flexible display positioned in a first plane, with respect to a viewing perspective of a user, the at least one first portion of the flexible display being configured to present at least depth information of information presented on the at least one second portion of the flexible display, and the at least one first portion of the flexible display and/or the at least one second portion of the flexible display being configured to be moveable along a trajectory prescribed by the vehicle.

13. The vehicle as claimed in claim 12, further comprising at least one rail, wherein the at least one rail defines the trajectory prescribed by the vehicle such that the at least one first portion of the flexible display and/or the at least one second portion of the flexible display is moveable along the at least one rail.

14. The vehicle as claimed in claim 12, wherein the vehicle further comprises a servo drive configured to adjust a distance between the at least one first portion of the flexible display and the at least one second portion of the flexible display automatically and dynamically based on information to be presented on the flexible display.

15. The vehicle as claimed in claim 12, wherein the flexible display includes an organic light-emitting diode display film.

16. The vehicle as claimed in claim 12, wherein the at least one second portion is at least partially transparent.

17. The vehicle as claimed in claim 12, further comprising at least one control button, presented on the at least one second portion of the flexible display, configured to activate at least one function of the vehicle, and wherein a distance between the at least one first portion of the flexible display and the at least one second portion of the flexible display is dynamically changeable according to the at least one function to be activated using the at least one control button.

18. The vehicle as claimed in claim 12, wherein in response to the user touching and/or operating a first control button among the at least one control button, the flexible display is configured to move the first control button from being presented on the at least one second portion of the flexible display to being presented on the at least one first portion of the flexible display.

* * * * *